United States Patent [19]

Hirai et al.

[11] Patent Number: 5,331,513
[45] Date of Patent: Jul. 19, 1994

[54] METHOD OF MOUNTING ELECTRONIC PART ON CIRCUIT SUBSTRATE AND CIRCUIT SUBSTRATE INCLUDING ELECTRONIC PARTS MOUNTED THEREON

[75] Inventors: Minoru Hirai; Osamu Tanaka, both of Kyoto, Japan

[73] Assignee: Rohm Co., Ltd., Kyoto, Japan

[21] Appl. No.: 908,993

[22] Filed: Jul. 6, 1992

[30] Foreign Application Priority Data

Jul. 12, 1991 [JP]  Japan ................................. 3-198735

[51] Int. Cl.⁵ ..................... H05K 7/02; H01R 43/00; H01R 9/00
[52] U.S. Cl. .................................. 361/760; 361/736; 361/752; 174/260; 29/842; 29/854; 29/859; 156/84; 156/380.6; 257/785
[58] Field of Search ............... 361/736, 748, 752, 760, 361/809; 174/52.2, 52.4, 260; 29/857–859, 854, 842, 843; 156/84–86, 380.6; 257/785

[56] References Cited

U.S. PATENT DOCUMENTS

| 4,695,926 | 9/1987 | McDermott . |
| 4,774,643 | 9/1988 | McGinnis et al. . |
| 4,858,075 | 8/1989 | Butterworth ....................... 361/736 |

OTHER PUBLICATIONS

Patent Abstracts of Japan, vol. 15, No. 130, Mar. 29, 1991 Appln. No. 3-14300.
Patent Abstracts of Japan, vol. 12, No. 228, Aug. 8, 1988 Appln. No. 63-65422.
Patent Abstracts of Japan, vol. 16, No. 285, Jun. 24, 1992 Appln. No. 4-72698.

*Primary Examiner*—Leo P. Picard
*Assistant Examiner*—Bot LeDynh
*Attorney, Agent, or Firm*—Oliff & Berridge

[57] ABSTRACT

In order to electrically connect the projecting electrodes of an LSI with a given wiring pattern on a circuit substrate, at least a portion of the electronic part is covered with a heat-shrinkable film member which in turn is fixedly mounted on the circuit substrate by adhesive at the opposite side or all the sides of the heat-shrinkable film member. When the heat-shrinkable film member is heated, the shrinkage of the heat-shrinkable film member presses the LSI against the circuit substrate under pressure. Thus, the bumps of the LSI can be electrically connected with the wiring pattern on the circuit substrate. Therefore, the LSI can be easily mounted on the circuit substrate or replaced by a new one.

13 Claims, 6 Drawing Sheets

METHOD OF MOUNTING ELECTRONIC PART ON CIRCUIT SUBSTRATE AND CIRCUIT SUBSTRATE INCLUDING ELECTRONIC PARTS MOUNTED THEREON

BACKGROUND OF THE INVENTION

1. Field of the Invention

The present invention relates to a structure and method useful for accurately mounting at least one electronic part such as a semiconductor device or the like on a circuit substrate.

2. Description of the Prior Art

Electronic parts such as integrated circuits (LSI) and the like are incorporated into a product after they have been mounted on a given circuit substrate. On mounting, it is required to ensure that the electrodes of the electronic parts are electrically connected with the corresponding wiring pattern on the circuit substrate.

For example, if it is wanted to mount an integrated circuit (LSI) on a circuit substrate, that is, where the projecting electrodes (hereinafter called "bumps") of the LSI are to be electrically connected with wiring patterns on the circuit substrate, the prior art used an electrically conductive paste for connecting the wiring patterns with the bumps (see FIG. 1). Such a paste may be a silver paste. Referring to FIG. 1, the bumps 12 of an LSI 11 are electrically connected with wirings 14 of a circuit substrate 13 through silver pastes 16.

Since the electrically conductive paste such as silver paste or the like is thermosetting, however, it is difficult to replace any failed integrated circuit with a new integrated circuit. When it is desired to replace an integrated circuit with a new one, the entire circuit substrate must be heated up to a temperature higher than the melting temperature of the silver paste. This may damage the other integrated circuits mounted on the same circuit substrate.

SUMMARY OF THE INVENTION

In order to overcome the aforementioned problems in the prior art, the present invention has an object to provide a method of reliably mounting at least one electronic part on a circuit substrate in such a manner that the electronic part can be more easily mounted on or removed from the circuit substrate and another object is to provide a practical circuit substrate on which an electronic part or parts are mounted.

To this end, the present invention provides a method of mounting at least one electronic part on a circuit substrate, comprising the step of contacting and fixing the electronic part with the circuit substrate under pressure due to the shrinkage of a heat-shrinkable film member so that the electrodes of the electronic part are electrically connected to a wiring pattern on the circuit substrate.

The heat-shrinkable film member is fixedly mounted on the circuit substrate over the electronic part. Under such a situation, the circuit substrate is heated to shrink the heat-shrinkable film member such that the electronic part is pressed and fixed against the circuit substrate under pressure.

More particularly, the present invention provides a circuit substrate with at least one electronic part mounted thereon such that the electrodes of the electronic part are electrically connected to a given wiring pattern on the circuit substrate, said circuit substrate comprising a heat-shrinkable film member fixedly mounted on the circuit substrate at the opposite sides or all the sides thereof, the heat-shrinkable film member covering at least a portion of the electronic part on the circuit substrate, the heat-shrinkable film member being heat shrunk to press the electronic part against the circuit substrate under pressure so that the electrodes of the electronic part are electrically connected to the wiring pattern of the circuit substrate.

The present invention further provides a method of mounting at least one electronic part on a circuit substrate so that the electrodes of the electronic part are electrically connected to a given wiring pattern on the circuit substrate, the method comprising the steps of placing the electronic part on the circuit substrate with the electrodes of the electronic part being coincident with the wiring pattern of the circuit substrate, covering at least a portion of the electronic part with a heat-shrinkable film member, fixing the heat-shrinkable film member to the circuit substrate at the opposite sides or all the sides thereof, and heat shrinking the heat-shrinkable film member to cause the electrodes of the electronic part to connect electrically with the wiring pattern on the circuit substrate.

Further, at least a portion of the electronic part on the circuit substrate is covered with the heat-shrinkable film member which is fixed to the circuit substrate at the opposite sides or all the sides thereof. When the heat-shrinkable film member is heat shrunk, the shrinkage thereof causes the electronic part to be pressed against the circuit substrate, thereby electrically connecting the electrodes of the electronic part with the wiring pattern of the circuit substrate.

The heat-shrinkable film member may be any thermosetting resin if it can laterally shrink to increase its thickness when heated because its volume remains constant. If an adhesive is used to fix the heat-shrinkable film member to the circuit substrate, the adhesive must not lose its adhesion even when subjected to the raised temperature required to shrink the heat-shrinkable film member.

As described, the present invention accurately places the electronic part on the circuit substrate such that the electrodes of the electronic part become coincident with the corresponding wiring pattern on the circuit substrate. Under such a situation, the entire assembly is heated to shrink the heat-shrinkable film member on the circuit substrate. The shrinkage of the heat-shrinkable film member fixed to the circuit substrate presses the electronic part against the circuit substrate under pressure.

In such a manner, the electronic part is urged against the circuit substrate while maintaining the coincidence of the electrodes of the electronic part with the corresponding wiring pattern on the circuit substrate. Thus, the electrodes of the electronic part will be pressed against the corresponding wiring pattern of the circuit substrate under pressure. Therefore, the electrical connection between the electrodes of the electronic part and the corresponding wiring pattern of the circuit substrate can be secured and maintained throughout the service life of the electronic part.

In accordance with the present invention, therefore, the electrodes of the electronic part can be electrically connected with the wiring pattern on the circuit substrate without need for any thermosetting paste such as silver paste. The heat-shrinkable film member can be easily fixed to and removed from the circuit substrate.

This can provide "a circuit substrate with at least one electronic part mounted thereon", in which the electronic part can be easily replaced by a new electronic part.

BRIEF DESCRIPTION OF THE DRAWINGS

FIG. 2b is a perspective view of a part of the circuit substrate of FIG. 2a;

FIG. 2c is a cross-sectional view, on an enlarged scale, of the circuit substrate of FIG. 2a;

FIG. 3 is a top view of the embodiment shown in section by FIG. 2a.

DETAILED DESCRIPTION OF THE PREFERRED EMBODIMENTS

The present invention will now be described in detail with reference to the accompanying drawings. It is, however, to be understood that the present invention is not limited to the illustrated embodiments.

Figure 1:
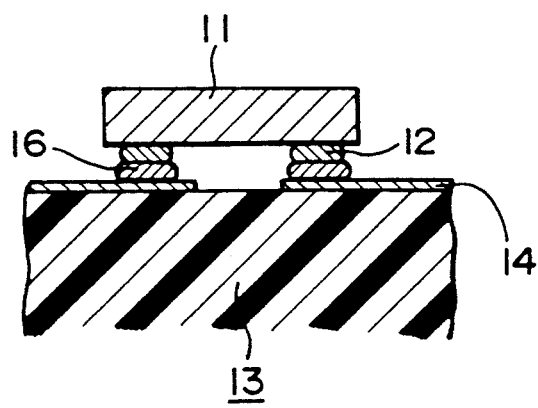
FIG. 1 is a schematic view illustrating a prior art technique of mounting an electronic part on a circuit substrate.
Figure 2A:
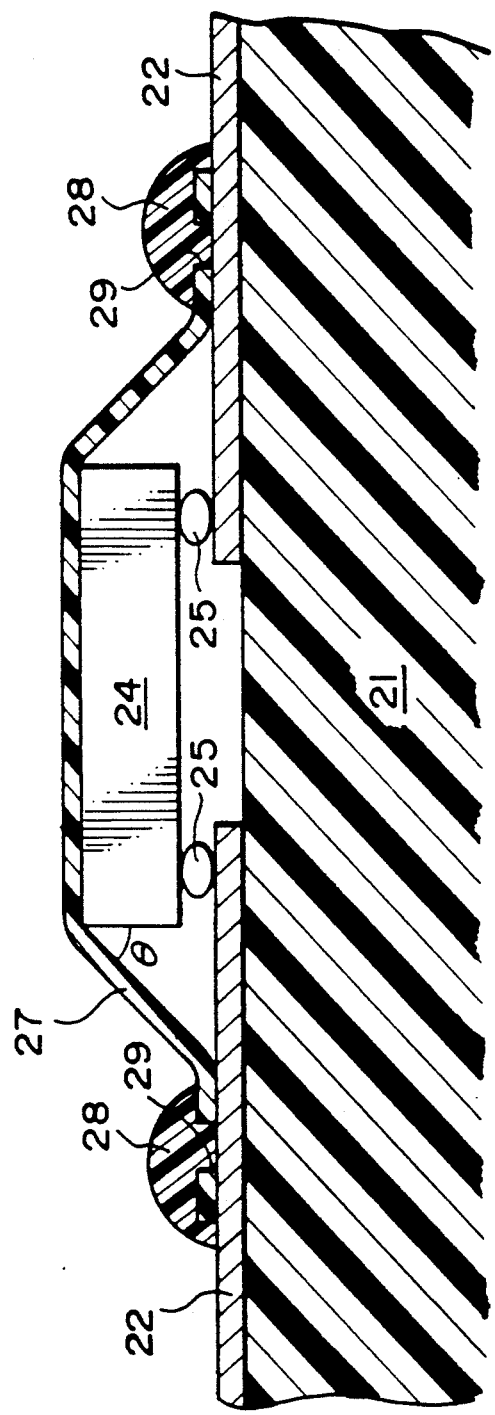
FIG. 2a is a cross-sectional view of a circuit substrate according to a preferred embodiment of the invention.
Figure 3:
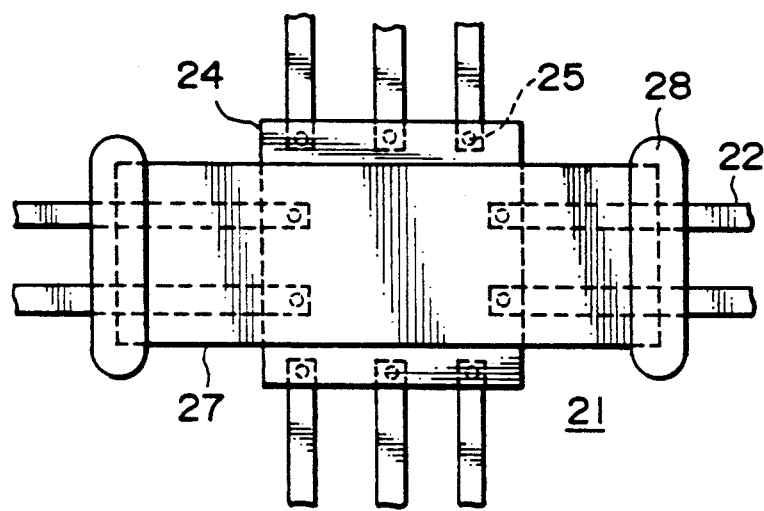

Referring to FIGS. 2a and 3, there is shown one embodiment of a circuit board constructed in accordance with the present invention, which comprises a circuit substrate 21 and at least one electronic part (e.g. LSI) 24 mounted on the circuit substrate 21 in such a manner as will be described later and having a plurality of projecting electrodes 25 which will be called "bumps". The circuit substrate 21 includes a given wiring pattern 22 to which the bumps 25 of the LSI 24 should be electrically connected.

At least a portion of the LSI 24 is covered with a heat-shrinkable film member 27 which is fixed to the circuit substrate 21 at the opposite sides or all the sides thereof through adhesive 28. When the heat-shrinkable film member 27 is heated, it shrinks to press the LSI 24 against the circuit substrate 21 under pressure. As a result, the bumps 25 of the LSI 24 will be electrically connected to the wiring pattern 22 on the circuit substrate 21.

In the illustrated embodiment, thus, at least a portion of the LSI on the circuit substrate 21 is covered with the heat-shrinkable film member 27 which is fixed to the circuit substrate 21 at the opposite sides or all the sides thereof. The heat-shrinkable film member 27 is then heat shrunk to press the LSI 24 against the circuit substrate 21 under pressure, so that the bumps 25 of the LSI 24 are electrically connected to the wiring pattern 22 of the circuit substrate 21.

Namely, the illustrated embodiment is characterized by that the heat shrunk film 27 presses the LSI 24 against the circuit substrate 21 so as to connect the bumps 25 of the LSI 24 electrically with the wiring pattern 22 of the circuit substrate 21.

Figure 2B:
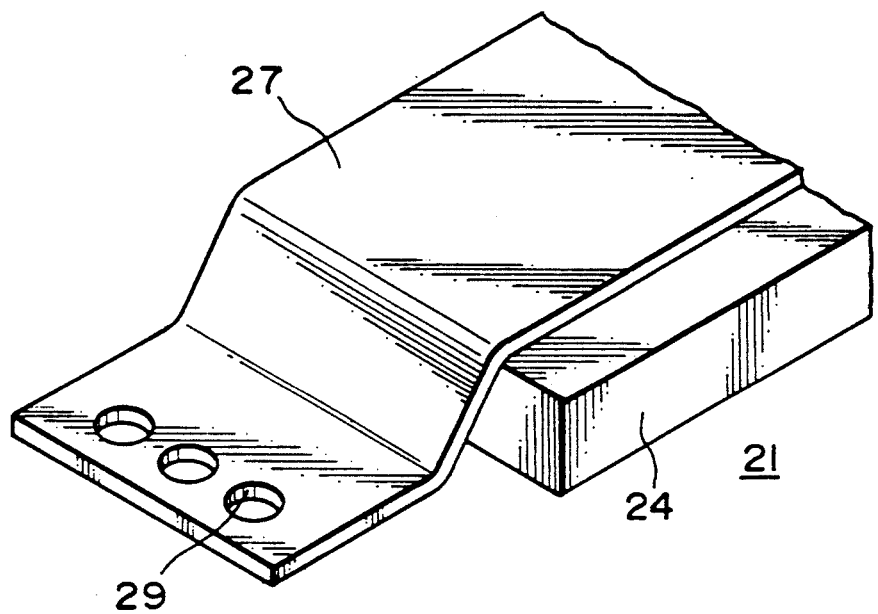
Figure 2C:
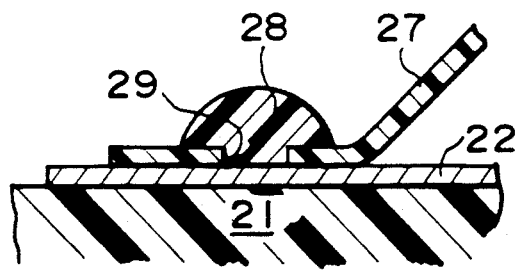

As seen from the perspective view of FIG. 2b, the adhesive 28 firmly mounts the heat-shrinkable film member 27 on the circuit substrate 21 through apertures 29 formed in the heat-shrinkable film member 27 at the opposite ends. The adhesive 28 flows into these apertures 29 to improve the intimate connection between the heat-shrinkable film member 27 and the circuit substrate 21 and also to effectively prevent the lateral shift in the heat-shrinkable film member 27 relative to the circuit substrate 21.

Figure 2D:
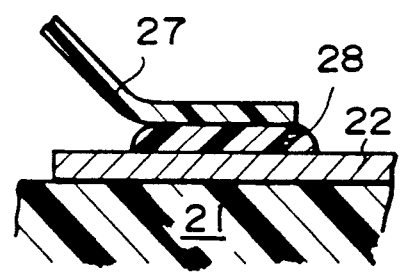
FIG. 2d to FIG. 2f show a circuit substrate according to a further preferred embodiment of the invention.
Figure 2E:
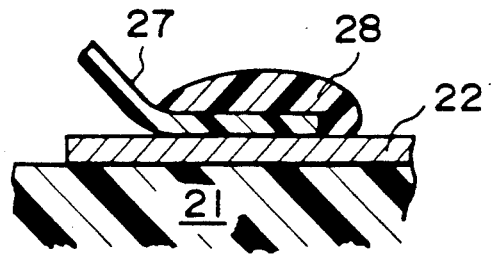
Figure 2F:
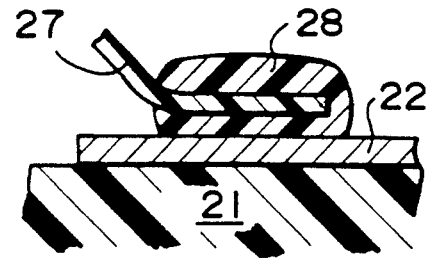

It is possible that the heat-shrinkable film member 27 may be mounted on the circuit substrate 21 with the film 27 spaced away from the circuit substrate 21 as will happen when there is a wiring pattern 22 between the circuit substrate 21 and the heat-shrinkable film member 27 (FIGS. 2d-f). However, the heat-shrinkable film member 27 may be adhered onto the circuit substrate 21 by any suitable means unless the connection between the heat-shrinkable film member 27 and the circuit substrate 21 is moved by the heat shrinkage of the heat-shrinkable film member 27.

As described, the LSI 24 is fixedly mounted on the circuit substrate 21 by covering the LSI 24 with the heat-shrinkable film member 27 fixed to the circuit substrate 21 and heat shrinking the heat-shrinkable film member 27 to press the LSI 24 against the circuit substrate 21.

Figure 4:
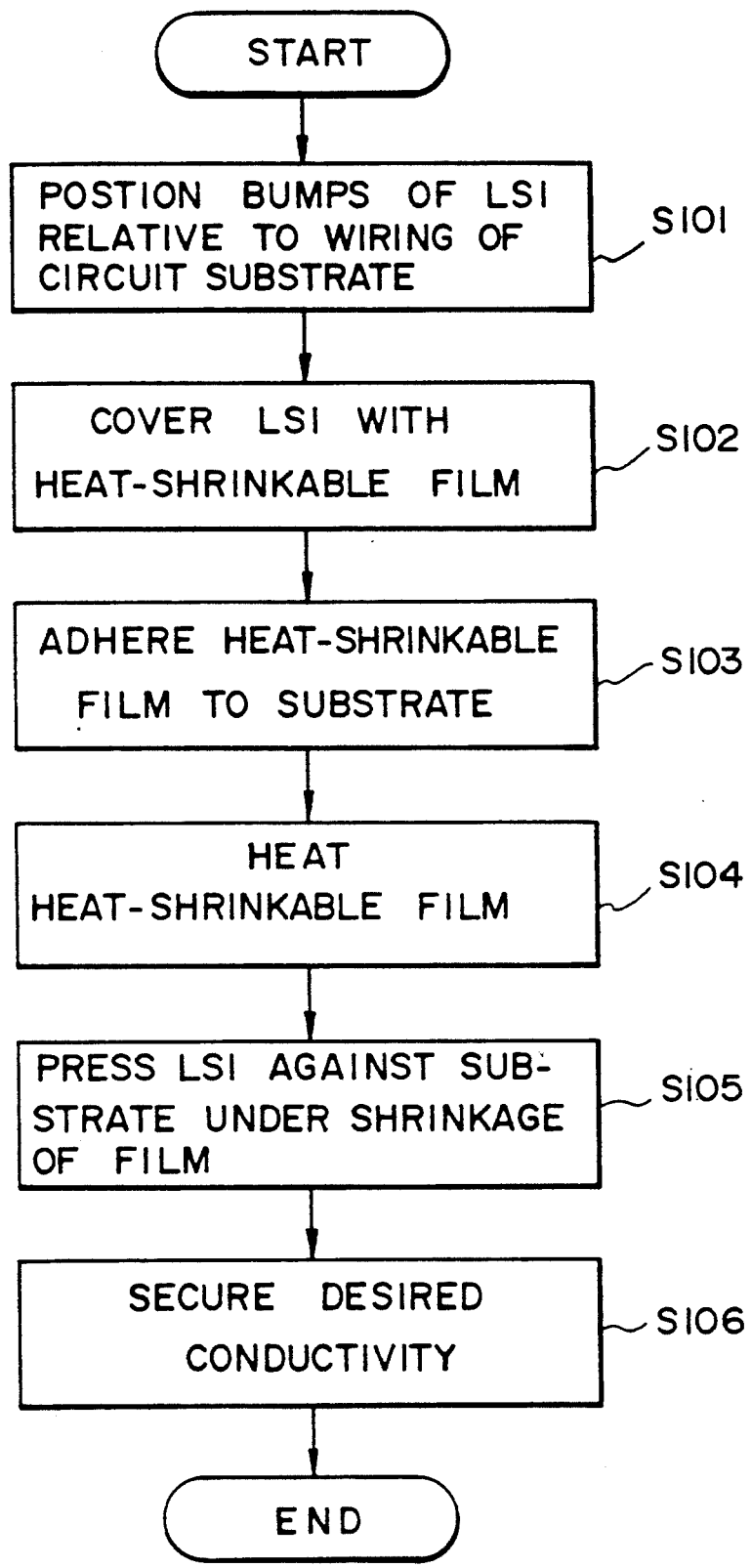
FIG. 4 is a flowchart illustrating a process according to a preferred embodiment of the present invention.

Such a process will be described with reference to FIG. 4.

Figure 5:
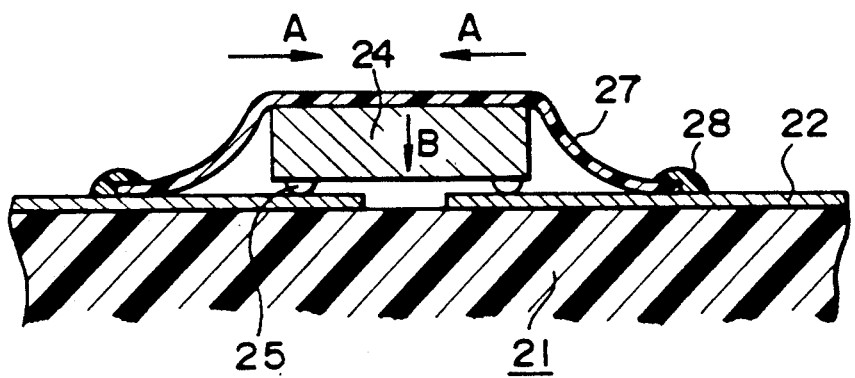
FIG. 5 is a schematic cross-section of the mounting means of the present invention.

First of all, the LSI 24 is placed on the circuit substrate 21 such that the bumps 25 of the LSI 24 are positioned coincident with the wiring pattern 22 on the circuit substrate 21 (S101). After the positioning step, at least a portion of the LSI 24 is covered with the heat-shrinkable film member 27 (S102). The heat-shrinkable film member 27 is then fixed to the circuit substrate 21 by the adhesive 28 at the opposite sides of the heat-shrinkable film member 27 (S103). Through the step S103, the heat-shrinkable film member 27 is firmly mounted on the circuit substrate 21. Under such a situation, the heat-shrinkable film member 27 is heated to shrink in a direction shown by arrow A in FIG. 5 (S104). The shrinkage of the heat-shrinkable film member 27 forces the LSI 24 in a direction shown by arrow B in FIG. 5 so that the LSI 24 will be pressed and fixed against the circuit substrate 21 (S105). Since the LSI 24 has been properly pre-positioned relative to the circuit substrate 21 in the step S101, the bumps 25 of the LSI 24 will be electrically connected with the wiring pattern 22 (S106) when the LSI 24 is pressed and fixed against the circuit substrate 21 in the step S105.

The heat-shrinkable film member 27 may be formed of any thermosetting resin. For example, thermosetting resins such as phenolic resin and melamine resin shrink to minimize its surface area through curing. When the thermosetting film is heated, thus, it normally shrinks in the lateral direction, but increases its own thickness. When the heat-shrinkable film member 27 formed of a thermosetting resin is heated, the thickness thereof increases and at the same time shown by arrow A in FIG. 5. Since the heat-shrinkable film member 27 is adhered to the circuit substrate 21 at the opposite sides, the lateral shrinkage of the heat-shrinkable film member 27 will be converted into an urging force in the direction shown by arrow B in FIG. 5. This forms the electrical connection between the bumps 25 of the LSI 24 and the wiring pattern 22 of the circuit substrate 21, as described. The relationship between the shrinkage of the heat-shrinkable film member 27 and the aforementioned urging force will now be described in more detail.

In FIG. 2l, it is assumed that an angle included between the heat-shrinkable film member 27 and the LSI 24 is $\theta$ and that the height and width of the LSI 24 are equal to 0.3 mm and 5 mm, respectively. If the heat-shrinkable film member 27 shrinks by 10%, it may be calculated that the urging force is equal to 20 g/mm$^2$. If the shrinkage factor of the heat-shrinkable film member 27 is equal to 50%, may be calculated that the urging force is equal to 100 g/mm$^2$. The shrinkage factor may be calculated by the original length minus the shrunk length divided by the original length.

It is desirable that the heat-shrinkable film member 27 is heat shrunk at a temperature ranged between 80° C. and 150° C. and preferably equal to about 100° C. Thermosetting resin having such a heat shrinkage property should be selected depending on its shrinkage factor in the aforementioned temperature range. Independently of its property and thickness, the thermosetting resin may be polyvinyl chloride, polyester or polyimide.

Considering the shrinkage temperature and the shrinkage factor in the aforementioned temperature range, it was preferred that the heat-shrinkable film member 27 was formed of a polyester film commercially available from SHINETSU POLYMER CO. under the trade name: SHRINK-FILM. If the shrinkage factor of the heat-shrinkable film member 27 is took large, the LSI 24 may be damaged during shrinkage of the heat-shrinkable film member 27. However, if the SHRINKFILM (trade name) is used to form the heat-shrinkable film member 27, the LSI 24 will not be damaged by the shrinkage of the heat-shrinkable film member 27 since the shrinkage factor thereof is appropriate.

The adhesive 28 used to adhere the heat-shrinkable film member 27 to the circuit substrate 21 is selected depending on the material of the heat-shrinkable film member 27 used. Considering the temperature required to shrink the heat-shrinkable film member 27, however, it is preferred that the adhesive will not lose its adhesion at a temperature ranged between 130° C. and 170° C. and more preferably equal to about 150° C. If the thermosetting resin adhesive is used, it is preferably one that may be set at a temperature ranged between 130° C. and 170° C. and more preferably equal to about 150° C. Such a temperature range is also preferable from the standpoint of preventing the LSI 24 from being damaged by heating. The adhesive which does not lose its adhesion when heated up to a temperature ranged between 130° C. and 170° C. is an epoxy resin adhesive, for example. However, the adhesive may be of any type provided it will not lose its adhesion when heated up to a temperature ranged between 130° C. and 170° C., such as photosetting resin. If the heat-shrinkable film member 27 is formed of SHRINK-FILM (trade name) as aforementioned, a good result can be obtained by using an epoxy resin adhesive commercially available from KONISHI BOND CO. under the trade name: BOND QUICK. This adhesive, BOND QUICK, is optimum for use in the illustrated embodiment since it sets at room temperature in about five minutes and yet has a strong adhesion that will not be lost even when heated up to a temperature ranged between 130° C. and 170° C.

In the illustrated embodiment, the heat-shrinkable film member 27 is fixedly mounted on the circuit substrate 21 at the opposite sides thereof. However, the present invention is not limited to such a mounting aspect. The heat-shrinkable film member 27 may be fixedly mounted on the circuit substrate 21 at any points if the LSI 24 can be pressed and fixed against the circuit substrate 21 by the shrinkage of the heat-shrinkable film member 27, for example, that is fixed to the circuit substrate 21 at all the sides of the heat-shrinkable film member 27. Furthermore, the means for fixing the heat-shrinkable film member 27 to the circuit substrate 21 is not limited to the adhesive 28 and may be in the form of any physical fixing means.

As will be apparent from the foregoing, the electronic part may be pressed against the circuit substrate while maintaining the coincidence of the electrodes of the electronic part with the wiring pattern. Thus, the electrodes of the electronic part will be pressed against the corresponding wiring pattern of the circuit substrate. This can secure and hold the electrical connection between the electrodes of the electronic part and the wiring pattern.

In accordance with the present invention, therefore, the electrodes of the electronic part can be electrically connected with the wiring pattern on the circuit substrate without the need of any thermosetting paste such as silver paste. The heat-shrinkable film member can be easily fixed to and removed from the circuit substrate. This can provide "a circuit substrate with at least one electronic part mounted thereon", in which the electronic part can be easily replaced by a new electronic part.

In accordance with the present invention, further, the connection between the integrated circuit and the circuit substrate will not be affected with respect to its position by replacing a failed integrated circuit with a new one since the heat-shrinkable film member is fixedly mounted on the circuit substrate at a position different from the connection between the integrated circuit and the circuit substrate. Since the setting temperature of the adhesive for the heat-shrinkable film member is equal to about 150° C., any other integrated circuits will not be damaged when the failed integrated circuit is replaced by a new one.

We claim:

1. A circuit substrate with at least one electronic part mounted thereon so that the electrodes of said electronic part are electrically connected with a wiring pattern on said circuit substrate, said circuit substrate comprising:

a heat-shrinkable film member fixedly mounted on said circuit substrate at the opposite sides or all the sides thereof, said heat-shrinkable film covering at least a portion of said electronic part on said circuit substrate; and an electrical connection for electrically connecting the electrodes and the wiring pattern by pressure from heat shrinking said heat-shrinkable film member to press said electronic part against said circuit substrate so that the electrodes of said electronic part are electrically connected with the wiring pattern of said circuit substrate.

2. A circuit substrate with at least one electronic part mounted on as defined in claim 1 wherein said heat-shrinkable film member is a heat-shrinkable film of thermosetting resin.

3. A circuit substrate with at least one electronic part mounted on as defined in claim 1 wherein said heat-shrinkable film member is fixedly mounted on said circuit substrate by adhesive.

4. A circuit substrate with at least one electronic part mounted on as defined in claim 3 wherein said heat-shrinkable film member includes apertures formed therethrough at positions at which said heat-shrinkable film member is to be secured to said circuit substrate through said adhesive, said adhesive flowing into said aperture to increase the adhesion from said adhesive.

5. A circuit substrate with at least one electronic part mounted on as defined in claim 1 wherein said heat-shrinkable film member is a heat-shrinkable film of polyester resin.

6. A circuit substrate with at least one electronic part mounted on as defined in claim 5 wherein said heat-shrinkable film member is secured to said circuit substrate by an epoxy resin adhesive.

7. A method of mounting at least one electronic part on a circuit substrate, said method comprising the steps of:
 positioning the electronic part on the circuit substrate; and
 fixing the electronic part to the circuit substrate by pressure due to the shrinkage of a heat-shrinkable film member so that the electrodes of the electronic part are electrically connected to a wiring pattern on the circuit substrate.

8. A method of mounting at least one electronic part on a circuit substrate so that the electrodes of the electronic part are electrically connected to a given wiring pattern on the circuit substrate, said method comprising the steps of:
 (a) placing the electronic part on the circuit substrate with the electrodes of the electronic part being coincident with the wiring pattern of the circuit substrate;
 (b) covering at least a portion of the electronic part with a heat-shrinkable film member;
 (c) fixing the heat-shrinkable film member to the circuit substrate at the opposite sides or all the sides thereof; and
 (d) heat shrinking the heat-shrinkable film member to cause the electrodes of the electronic part to connect electrically with the wiring pattern on the circuit substrate.

9. A method as defined in claim 8 wherein said heat-shrinkable film member is a heat-shrinkable film of thermosetting resin.

10. A method as defined in claim 8 wherein said heat-shrinkable film member is fixedly mounted on the circuit substrate by adhesive.

11. A method as defined in claim 10 wherein said heat-shrinkable film member includes apertures formed therethrough at positions at which said heat-shrinkable film member is to be secured to said circuit substrate by said adhesive.

12. A method as defined in claim 8 wherein said heat-shrinkable film member is a heat-shrinkable film of polyester resin.

13. A method as defined in claim 12 wherein said heat-shrinkable film member is secured to said circuit substrate by an epoxy resin adhesive.

* * * * *